United States Patent [19]

Utaka et al.

[11] Patent Number: 4,589,117
[45] Date of Patent: May 13, 1986

[54] BUTT-JOINTED BUILT-IN SEMICONDUCTOR LASER

[75] Inventors: Katsuyuki Utaka, Musashino; Kazuo Sakai; Shigeyuki Akiba, both of Tokyo; Yuichi Matsushima, Tokorozawa, all of Japan

[73] Assignee: Kokusai Denshin Denwa Kabushiki Kaisha, Tokyo, Japan

[21] Appl. No.: 502,589

[22] Filed: Jun. 9, 1983

[30] Foreign Application Priority Data

Jun. 10, 1982 [JP] Japan ................................. 57-98495

[51] Int. Cl.⁴ .............................................. H01S 3/19
[52] U.S. Cl. ....................................... 372/50; 357/17; 372/45; 372/96
[58] Field of Search ..................... 372/44, 50, 96, 45; 357/17

[56] References Cited

U.S. PATENT DOCUMENTS 4,464,762  8/1984  Furuya et al. ........................ 372/50

Primary Examiner—James W. Davie
Attorney, Agent, or Firm—Robert E. Burns; Emmanuel J. Williams; Bruce L. Adams

[57] ABSTRACT

A semiconductor laser, in which active layers are provided on the top surface of the mesa and the remainder surface in a substrate as a first semiconductor layer. Second semiconductor layers are provided on the active layers to such a thickness that the second semiconductor layer may not reach the first semiconductor layer on the mesa. Third semiconductor layers are provided on the second semiconductor layer to such a thickness that the third semiconductor layers may be flush with or higher than the first semiconductor layer on the mesa, so that the first semiconductor layer on the top surface of the mesa is just jointed with the third semiconductor layer on the remainder surface in the substrate.

3 Claims, 6 Drawing Figures

BUTT-JOINTED BUILT-IN SEMICONDUCTOR LASER

BACKGROUND OF THE INVENTION

The present invention relates to a semiconductor laser having an active layer and an optical waveguide layer coupled with each other at a high efficiency and a method for manufacturing such a semiconductor laser.

A semiconductor laser of the type having an active layer and an optical waveguide layer formed as a unitary structure with each other is promising because it is adaptable to an integrated optics laser and an optical integrated circuit in which a plurality of optical active elements are coupled with one another via an optical waveguide. As a structure in which the active layer and the optical waveguide layer are coupled with each other at a high efficiency, a BJB (Butt-Jointed Built-in) structure is described in detail by Mr. Abe et al in Electronics Letter, Vol. 17, No. 25, 1981, pp. 945-947. The BJB structure has such a construction that the butt-joint system for optical fiber splicing by butting together their cores is applied to a semiconductor laser.

However, since the conventional BJB structure involves two liquid growth steps, the yield rate is relatively low.

SUMMARY OF THE INVENTION

In view of the abovesaid defect, an object of the present invention is to provide a semiconductor laser and its manufacturing method which permits the fabrication of the BJB structure by one crystal growth step.

In accordance with the present invention, active layers are provided on the top surface of the mesa and the remainder surface in a substrate as a first semiconductor layer. Second semiconductor layers are provided on the active layers to such a thickness that the second semiconductor layer may not reach the first semiconductor layer on the mesa. Third semiconductor layers are provided on the second semiconductor layer to such a thickness that the third semiconductor layers may be flush with or higher than the first semiconductor layer on the mesa, so that the first semiconductor layer on the top surface of the mesa is just jointed with the third semiconductor layer on the remainder surface in the substrate.

Thus, active layers are provided on the top surface of the mesa portion and the "recessed" surface of the substrate, as a first semiconductor layer. Second semiconductor layers are provided on the active layers to such a thickness that the second semiconductor layer does not reach the first semiconductor on the mesa. Third semiconductor layers are provided on the second semiconductor layer to such a thickness that the third semiconductor layers are flush with or higher than the first semiconductor layer on the mesa portion, so that the first semiconductor layer on the top surface of the mesa portion is just jointed with the third semiconductor layer on the recessed surface on the substrate.

BRIEF DESCRIPTION OF THE DRAWINGS

The present invention will be described in detail below in comparison with prior art with reference to the accompanying drawings, in which.

DETAILED DESCRIPTION

For ready understanding the present invention, an example of conventional BJB structure will first be described with reference to FIG. 1.

Figure 1:
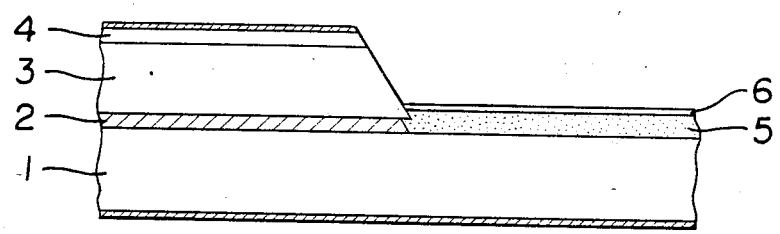
FIG. 1 is a sectional view showing a BJB structure produced by a conventional method involving two crystal growth steps.

In FIG. 1, reference numeral 1 indicates an InP substrate; 2 designates an undoped InGaAsP active layer; 3 identifies a p-type InP clad layer; 4 denotes a p-type InGaAsp cap layer; 5 represents an undoped InGaAsP optical waveguide layer; and 6 shows an undoped InP layer. Since the active layer 2 and the optical waveguide layer 5 are butted together as will be seen from FIG. 1, the BJB structure has features such that optical power confined in the active layer 2 is propagated in the optical waveguide 5 at a coupling efficiency theoretically equal to 100%, and that severe control of the thickness and composition of each layer, which is needed in the fabrication of the structure for obtaining a high degree of coupling is alleviated.

Heretofore, this BJB structure has been manufactured by two crystal growth steps. That is, in FIG. 1, the undoped InGaAsP active layer 2, the p-InP clad layer 3 and the p-InGaAsP cap layer 4 are formed one after another on the flat n-(100) InP substrate 1 by a first liquid growth step. Next, the cap layer 4 and the p-InP clad layer 3 are selectively removed by chemical etching and, in the second liquid growth step, the active layer 2 is selectively melted back, which is followed by growing the undoped InGaAsP optical waveguide layer 5 and the undoped InP layer 6. As described above, the conventional BJB structure involves two liquid growth steps, and hence is disadvantageous in terms of production yield.

With reference to the accompanying drawings, the present invention will hereinafter be described in detail.

Figure 2A:
FIGS. 2(a), 2(b) and 2(c) are a series of sectional views explanatory of the process of growing the BJB structure by one crystal growth step according to the present invention.
Figure 2B:
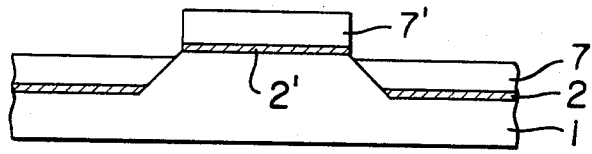
Figure 2C:
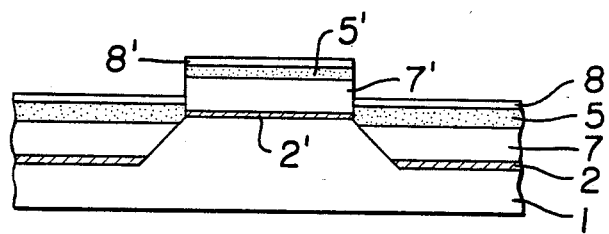
Figure 3:
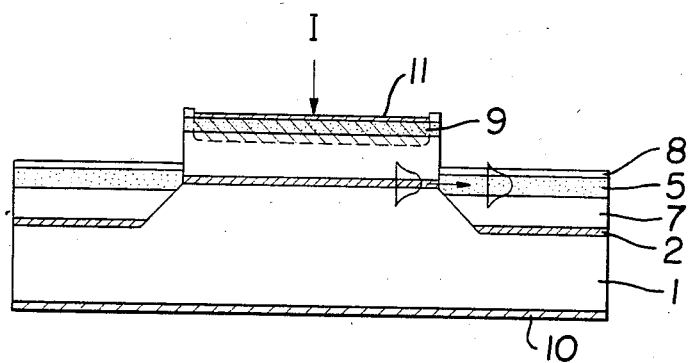
FIG. 3 is a sectional view illustrating a semiconductor laser having the BJB structure grown by the method of the present invention and the propagation manner of the light distribution.

FIGS. 2(a), 2(b) and 2(c) illustrate a sequence of steps of growing a BJB structure according to an embodiment the present invention which employs, by way of example, an InGaAsP crystal. At first, a mesa of 300 to 500 $\mu$m width and 2 to 3 $\mu$m depth is formed on the n-(100)InP sybstrate 1 along <01$\bar{1}$> through photolithography and chemical etching using an HCl system, etc. [FIG. 2(a)]. After removal of photoresist used as a mask, undoped InGaAsP active layers (of a composition $\lambda g \sim 1.55$ $\mu$m) 2 and 2' and p-InP or InGaAsP layers ($\lambda g \sim 1.0$ $\mu$m) 7 and 7' are grown by liquid phase epitaxy as first and second semiconductor layers, respectively [FIG. 2(b)]. Further undoped InGaAsP optical waveguide layers ($\lambda g \sim 1.3$ $\mu$m) 5 and 5', and undoped InP or InGaAsP layers ($\lambda g \sim 1.0$ $\mu$m) 8 and 8' are grown, in succession, as third and fourth semiconductor layers, respectively [FIG. 2(c)]. In this case, since the mesa is wide, the respective layers are also formed on the top surface of the mesa. However, they are discontinuous from those on the flat surface portion of the substrate. Further, by controlling the growth time of the p-InP or InGaAsP layers 7 and 7', the active layer 2' can be formed so as to have its periphery or marginal edge meeting with the optical waveguide layer 5 as shown. Namely, the second semiconductor layers 7 and 7' are formed to such a thickness that the semiconductor layer 7 may not reach the first semiconductor layer 2' on the mesa, and the third semiconductor layers 5 and 5' are formed to such a thickness that the semiconductor layer 5 may be flush with or higher than the first semiconductor layer 2' on the mesa. In this case, by adjusting the composition and thickness of the optical waveguide layer 5 so that the light distribution and propagation constant therein may coincide with those in the active layer 2', the optical waveguide 5 and the active layer 2' can be coupled with each other at a high efficiency so as to define a resonant cavity in combination. By the way, the InGaAsP layer 5' grown on the mesa and having the same composition as the optical waveguide layer 5 is used as a cap layer for reducing an ohmic resistance. In this case, it need not always be provided since the InP layer, or InGaAsP layer 8' close in composition thereto, formed on the optical waveguide layer 5', lowers the ohmic resistance value; however, by selectively etching away the layer 8' at a site for forming an electrode, the InGaAsP layer 5' as the cap layer is exposed, by which is attained the purpose of reducing the ohmic resistance. FIG. 3 illustrates a cross section of the semiconductor laser thus fabricated and how the light distribution propagates therein. In FIG. 3, reference numeral 9 indicates a Zn diffused region, and 10 and 11 designate electrodes on n and p sides, respectively.

Figure 4:
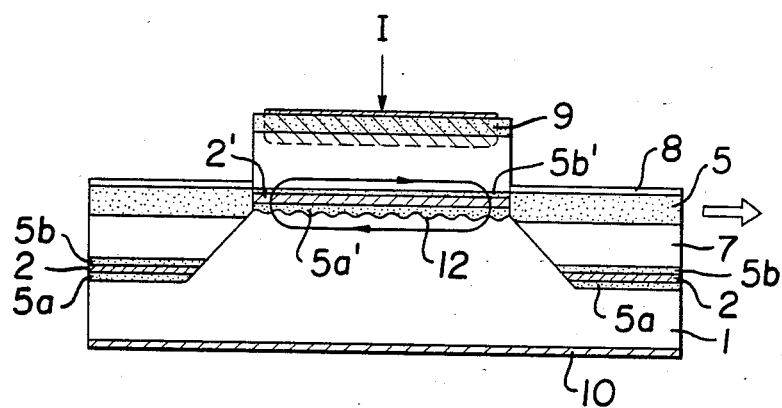
FIG. 4 is a sectional view of an element showing the present invention as being applied to a DFB laser.

In the embodiments of FIGS. 2(a), 2(b), 2(c) and 3, the top surface of the mesa is flat and, for the sake of simplicity, the active layer 2 is shown to be formed directly on the mesa. However, the present invention is also applicable to such a DFB (distributed feedback) laser as shown in FIG. 4 in which corrugations 12 are formed only on the top surface portion of the mesa for providing periodic refractive index variations and InGaAsP layers 5a and 5a', active layers 2 and 2' and InGaAsP buffer layers 5b and 5b' are formed one after another, the layers 5a and 5a' being larger in energy gap but smaller in refractive index than the active layers 2 and 2', so that a resonant cavity is formed by the active layer 2' on the mesa or a DBR (distributed Bragg-reflector) laser in which periodic corrugations are formed on the optical waveguide after the growth of respective layers, though not shown. Moreover, since the BJB structure is produced by one crystal growth step as in this embodiment, the semiconductor laser can be also manufactured by two crystal growth steps when a buried (BH) layer structure is introduced thereinto.

Besides, the present invention is applicable not only to the liquid phase epitaxy but also to the vapor phase epitaxy which is excellent in the composition of the semiconductor crystal and in controllability and uniformity of the film thickness.

As has been described in detail in the foregoing, according to the present invention, the BJB (Butt-Jointed Built-in) structure which is promising as a semiconductor laser can be produced by one crystal growth step, permitting simplification of the manufacturing process and enhancement of the production yield.

What we claim is:

1. A butt-jointed built-in semiconductor laser comprising: a semiconductor substrate having a mesa-shaped stepped portion extending perpendicularly to the direction of an optical axis of the semiconductor laser and having a predetermined width so that a recessed portion is provided adjacent said mesa-shaped stepped portion; a first semiconductor layer formed on said recessed portion and on top of said mesa-shaped stepped portion of said semiconductor substrate, said first semiconductor layer being discontinuous between the top of said mesa stepped portion and said recessed portion, said first semiconductor layer serving as an active layer in a resonant cavity including the same; a second semiconductor layer of a material reverse in conductivity type from said substrate and larger in energy gap but smaller in refractive index than said first semiconductor layer and formed on top of said first semiconductor layer on said recessed portion and said mesa-shaped portion, said second layer being discontinuous between the top of said mesa-shaped portion and said recessed portion and of a thickness such that said second semiconductor layer on said recessed portion is not in contact with said first semiconductor layer formed on the mesa-shaped stepped portion; a third semiconductor layer of a material having an energy gap and a refractive index intermediate between those of said first and second semiconductor layers and formed on said semiconductor layer to such a thickness that said third semiconductor layer formed on said recessed portion extends at least to the top of said first semiconductor layer formed on said mesa-shaped stepped portion; a fourth semiconductor layer of a material larger in energy gap but smaller in refractive index than said third semiconductor layer and formed on said third semiconductor layer on said mesa-shaped stepped portion and said recessed portion; and a pair of electrodes provided on surfaces of said substrate and said fourth semiconductor layer in opposing relation to each other across said semiconductor layer on said mesa-shaped stepped portion.

2. A butt-jointed built-in semiconductor laser according to claim 1, in which said resonant cavity is defined by said first semiconductor layer formed on said top of said mesa-shaped stepped portion and said third semiconductor layer formed on said recessed portion.

3. A butt-jointed built-in semiconductor laser according to claim 1, in which said top of said mesa-shaped stepped portion has corrugations, buffer layers sandwiching said first semiconductor layer formed on said top of said mesa-shaped stepped portion thereby to define said resonant cavity.

* * * * *